United States Patent [19]

Normington

[11] Patent Number: 5,397,916
[45] Date of Patent: * Mar. 14, 1995

[54] SEMICONDUCTOR DEVICE INCLUDING STACKED DIE

[76] Inventor: Peter J. C. Normington, 516 E. Country Plaza South, Gilbert, Ariz. 85234

[*] Notice: The portion of the term of this patent subsequent to Jan. 25, 2011 has been disclaimed.

[21] Appl. No.: 95,524

[22] Filed: Jul. 26, 1993

Related U.S. Application Data

[63] Continuation-in-part of Ser. No. 805,594, Dec. 10, 1991, Pat. No. 5,281,852.

[51] Int. Cl.⁶ .......................................... H01L 23/02
[52] U.S. Cl. ................................... 257/686; 257/692; 257/696; 257/723
[58] Field of Search ............... 257/685, 686, 692, 723, 257/696, 771, 693, 725

[56] References Cited

U.S. PATENT DOCUMENTS

| | | | |
|---|---|---|---|
| 4,500,905 | 2/1985 | Shibata | 257/771 |
| 4,553,020 | 11/1985 | Val | 257/682 |
| 4,770,640 | 9/1988 | Walter | 439/69 |
| 4,868,712 | 9/1989 | Woodman | 361/388 |
| 4,890,154 | 12/1989 | Sahakian | 257/696 |
| 4,953,005 | 8/1990 | Carlson et al. | 357/80 |
| 4,956,694 | 9/1990 | Eide | 257/723 |
| 4,956,695 | 9/1990 | Robinson et al. | 357/74 |
| 4,996,587 | 2/1991 | Hinrichsmeyer et al. | 257/686 |
| 5,016,138 | 5/1991 | Woodman | 257/686 |
| 5,053,852 | 10/1991 | Biswas et al. | 257/696 |

*Primary Examiner*—Rolf Hille
*Assistant Examiner*—Roy Potter
*Attorney, Agent, or Firm*—Cahill, Sutton & Thomas

[57] ABSTRACT

Leadframes from a TAB tape having die attached are curved and the free ends of the leads curve back over themselves. A separator, attached to the die, defines a pocket for receiving the free end of the leads. The die and separator form a subassembly which is combined with other subassemblies to make the stack. Sides having an array of conductive contact areas connected in a predetermined pattern are placed against the edges of the die to touch the curved leads which form a resilient contact with the sides. A resilient member is located within the curved leads to support the leads during assembly. In one embodiment, the leads are wrapped around the edges of the die itself. In other embodiments, the leads are wrapped around the edge of the separator. A first construction of the stack facilitates assembly of the stack from the bottom up and a second construction facilitates assembly of the stack from the top down.

7 Claims, 4 Drawing Sheets

SEMICONDUCTOR DEVICE INCLUDING STACKED DIE

This application is a continuation-in-part of applications Ser. No. 07/805,594, filed Dec.10, 1991, now U.S. Pat. No. 5,281,852.

BACKGROUND OF THE INVENTION

This invention relates to a semiconductor device having a plurality of integrated circuit die in a stack and, in particular, to a resilient connection to the die in the stack and a method for assembling the stack.

The continued increase in the density of integrated circuits, i.e. the number of transistors per square centimeter of die area, whets rather than satisfies the appetite of industry for further increases. One solution to the problem is to stack several die one on another within a single package. For the sake of description only, the stack is described as vertical (with the die horizontal) and the die are considered rectangular. "Die" are also referred to as "chips" in the industry.

As recognized in the art, there are several difficulties with this approach. A first difficulty with stacked die is the limitation imposed by the heat generated by each die. When packaged singly and mounted on a printed circuit board, the heat generated by the die during operation is relatively easily dissipated because the die are spread out across the printed circuit board. When grouped together, particularly in a stack, power dissipation restricts the type of die that are stacked to relatively low power integrated circuits.

It is generally assumed in the art that the primary cooling mechanism for the die is conductive cooling through the leads from the die, with some radiative cooling from the leads. Thus, organizing the die in a stack according to their power dissipation, e.g. putting the die generating the most heat on top of the stack, is not effective. Further, most applications use identical die in the stack, e.g. memory devices. One can obtain, for example, a four-fold increase in memory size on a given size printed circuit board by using stacked die.

One solution to the problem of heat dissipation is described in U.S. Pat. No. 5,051,865, in which one side of the stack is provided with electrical connections and the opposite side of the stack is provided with a heat sink to which the die are thermally, but not electrically, connected. A problem with this approach is that one side of the stack is devoid of electrical connections, which limits the number of leads that the die can have and, to some extent, limits the geometry of the die.

An ancillary problem to heat dissipation is stress in the die due to thermal cycling. Specifically, the temperature coefficient of expansion for the die should be matched by the package to prevent compression or distortion of the die due to temperature changes. In packages of the prior art, the die are mechanically and electrically connected to the sides, e.g. by soldering. If the sides, top, and bottom of the package do not have the same, or nearly the same, temperature coefficient of expansion as the die, then the die may be subjected to stress as their temperature rises. This can lead to contact separation or fracture of the interconnect layers on the die.

A second difficulty with stacked die is the density of the die themselves. Power supply, ground, control signals, and input and output signals must all be supplied to all die in the stack. The number of leads depends on the particular die but can be as many as four hundred. Thus, the device used to interconnect the die must have at least this number of conductors. In theory, the conductors can be made arbitrarily thin. In practice, thin conductors limit the amount of current that can be carried by the conductors, limit the amount of cooling through the conductors, and cause registration problems between the leads from the die and the contact areas on the side interconnect.

The side panel used to interconnect the die has taken several forms. In U.S. Pat. No. 5,006,925, chip carriers form the sides of the stack and are soldered together. There are holes in the chip carriers for ventilation. In U.S. Pat. No. 4,983,533, a plurality of die are glued together and electrically connected by solder bumps on a silicon substrate attached to the side of the stack.

U.S. Pat. No. 4,935,005 discloses depositing conductors on the sides of the already formed stack to contact the leads from the die. The die are attached to TAB (tape automatic bonding) leadframes, mounted on an insulating member having a recess for receiving the die. The tape is used to align the die while the die and insulating members are glued together. The portions of the tape extending beyond the insulating member are then removed and the conductors are deposited. A TAB leadframe is also disclosed for connecting the stack to a small circuit board which serves as the bottom of the package and which carries a plurality of conductive pins.

Each stage of an assembly process introduces defects which must be detected and corrected. Taking apart stack packages of the prior art is difficult or impossible to do non-destructively. Depending upon the number and type of die used, it is often less expensive to throw a defective stack away rather than to repair it.

In view of the foregoing, it is therefore an object of the invention to provide an improved package for stacked semiconductor die.

Another object of the invention is to provide a package which can be disassembled for enclosing stacked semiconductor die.

A further object of the invention is to provide a method for packaging stacked semiconductor die.

Another object of the invention is to provide a resilient connection between semiconductor die and the sides of a stack.

A further object of the invention is to provide a package for stacked semiconductor die in which the temperature coefficient of expansion of the package need not be matched to that of the die.

Another object of the invention is to provide a package for stacked semiconductor die which enables improved fluid flow around the die for cooling the die.

SUMMARY OF THE INVENTION

The foregoing objects are achieved in the invention wherein the die to be stacked are attached to leadframes on a TAB tape. The leadframes from a TAB tape are separated from each other and the leads on each of the four sides are curled back on themselves with the leads on the outside to form a resilient contact. An insulating separator is adjacent the back of each die and holds the leads in place by trapping the leads in a peripheral pocket within which the leads can move. The die and separator are a subassembly which is combined with other subassemblies to form a stack with alternating layers of die and separators. The stack is not glued together. Sides, having a suitable conductive pattern on their inside surfaces, are brought into registration with the leads from the die. The curved tape and leads form a resilient contact with the sides. The sides are electrically connected, preferably by a flexible circuit, to a substrate containing a plurality of connector pins and serving as the bottom of the package. A top is mechanically attached to the sides, completing the package. Because the contacts for the sides are the leads partially wrapped around the die itself, a very compact stack is obtained. In an alternative embodiment of the invention, the leads are wrapped around a die carrier, which also serves as a separator. In another alternative embodiment of the invention, the outer ends of the leads are wrapped around the separator and the stack is assembled from the top down rather than from the bottom up.

A more complete understanding of the invention can be obtained by considering the following detailed description in conjunction with the accompanying drawings in which.

Figure 10:
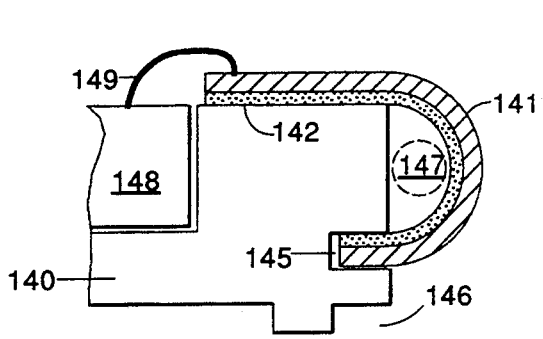
Figure 11:
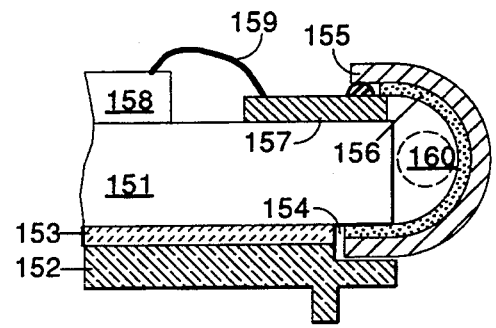
Figure 12:
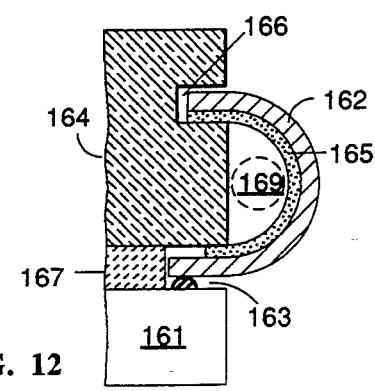
Figure 13:
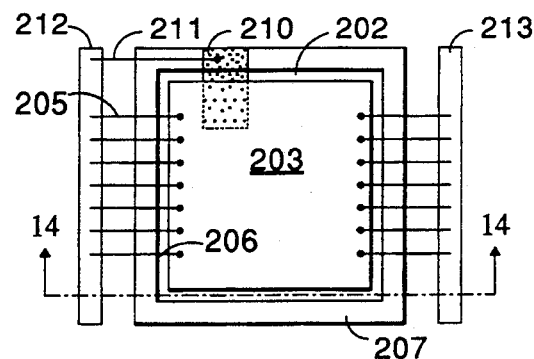
Figure 14:
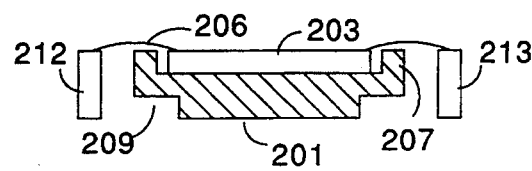

FIG. 10 a cross-section of a portion of a subassembly constructed in accordance with an alternative embodiment of the invention;

FIG. 11 is a cross-section of a portion of a subassembly in which the separator is a multi-element structure;

FIG. 12 is a cross-section of a portion of a subassembly constructed in accordance with another alternative embodiment of the invention;

FIG. 13 illustrates a subassembly constructed in accordance with an alternative embodiment of the invention;

FIG. 14 is a cross-section along line 14—14 in FIG. 13.

Figure 15:
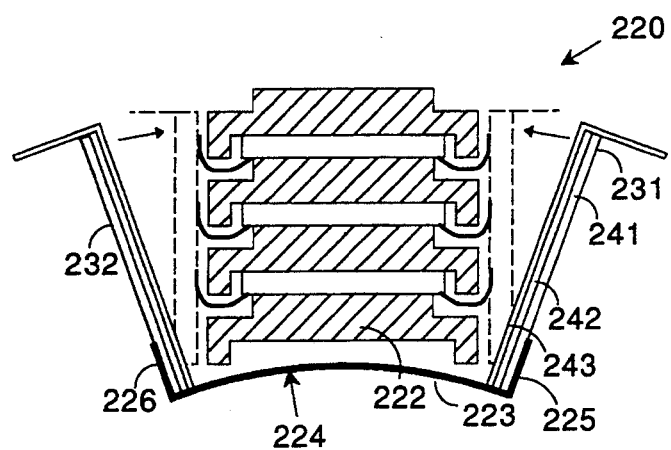
Figure 16:
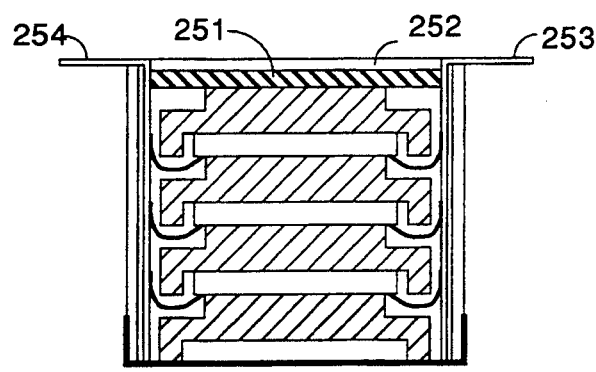

FIG. 15 illustrates the assembly of a stack in accordance with the invention; and FIG. 16 illustrates a completed stack constructed in accordance with an alternative embodiment of the invention.

DETAILED DESCRIPTION

Figure 1:
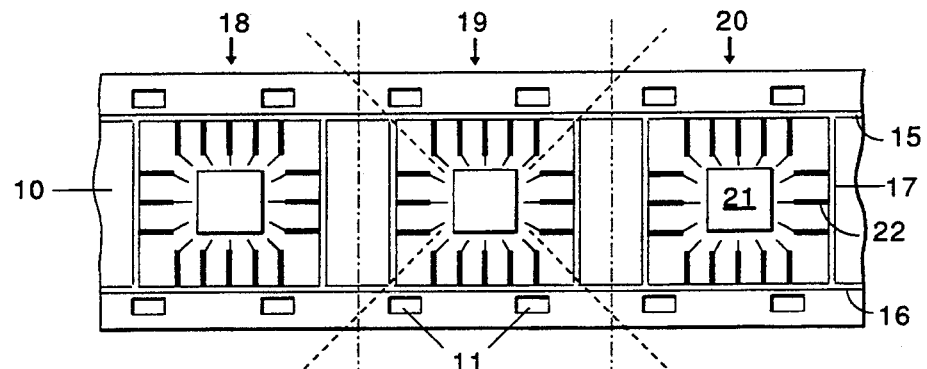
FIG. 1 illustrates a TAB leadframe assembly for use in accordance with the invention.

FIG. 1 illustrates a small section of TAB tape having three die thereon. Specifically, tape 10 typically includes a layer of polyimide one to four mils (0.025–0.1 mm.) thick. For use in the invention, one mil (0.025 mm.) tape is preferred. A row of regularly spaced sprocket holes 11 is formed along each edge of the tape for locating and moving the tape. Deposited on the tape, and located relative to sprocket holes 11, is a repeating pattern of conductive material including conductive runs 15 and 16, bars 17, and leadframes 18, 19, and 20.

Each leadframe has a plurality of leads, such as lead 22, extending radially outward from die 21, which is attached to the tape at the center of each leadframe by a suitable adhesive. A substantial portion of each lead is aligned as shown, perpendicular to the edge of the die, to provide a contact as described below. As well known in the art, contact regions are formed in the upper surface of die 21 and are connected to respective leads by wire bonding, welding, or solder bumps.

Figure 2:
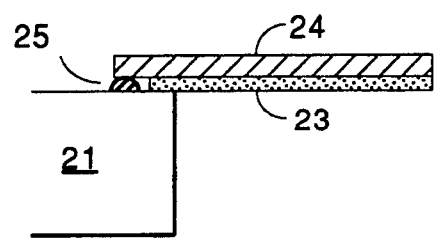
FIG. 2 is a cross-section of a lead bonded to a die in accordance with the invention.

FIG. 2 illustrates a lead connected to die 21 by a solder bump. The solder bump is simply a bead of solder formed as the uppermost metal layer in a contact region on die 21. After the end of lead 24 is located above solder bump 25, heat is applied to melt the solder and form the electrical connection. As previously indicated, polyimide layer 23 preferably has a thickness of one mil (0.025 mm). The conductive layer is preferably copper approximately 1.5 mils (0.038 mm.) thick having a thin gold layer deposited thereon for corrosion resistance and lower contact resistance.

The leadframes and die are not packaged at this point, as in the TAB process, but are separated along the vertical cut lines indicated in FIG. 1 and placed in a suitable fixture for bending the leads. The tape is cut along the diagonal lines indicated in FIG. 1 and the polyimide layer and the leads are bent to form resilient contacts in accordance with the invention. The leads are either trimmed to separate them from runs 15 and 16 and bars 17 or are left connected at this point.

If there are a large number of leads, it is preferred that the runs and bars remain. This is because a large number of leads necessitates a narrower lead. Even though the leads are attached to the polyimide layer, the bars and runs provide additional strength as well as maintain the stiffness of the tape in the direction of the bar or run.

Figure 3:
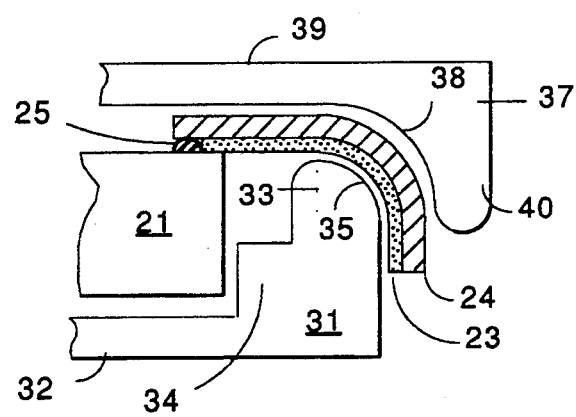
FIGS. 3 and 4 illustrate the curvature of the leads in accordance with the invention.

FIG. 3 illustrates a portion of the tool for bending the leads. Fixture 31 includes a base portion 32 and a perimeter wall 33. Shoulder 34 spaces die 21 a predetermined distance from wall 33. Upper surface 35 of wall 33 is curved. Mold 37 has a complementary curve formed between upper surface 39 and side 40 thereof.

Initially, lead 24 extends away from the edge of die 21 as illustrated in FIG. 2. After being placed in fixture 31, mold 37 is lowered over fixture 31, bending the outer portion of lead 24 into a curved shape, deforming the outer portion. The lead is bent with the underlying polyimide layer on the inside of the curve. Mold 37 curves the lead back on itself through approximately a ninety degree curve. The mold is then removed. If the bars and runs were not removed earlier, they are removed now since the curvature of the lead and polyimide layer provides adequate stiffness along the edge of the die.

Figure 4:
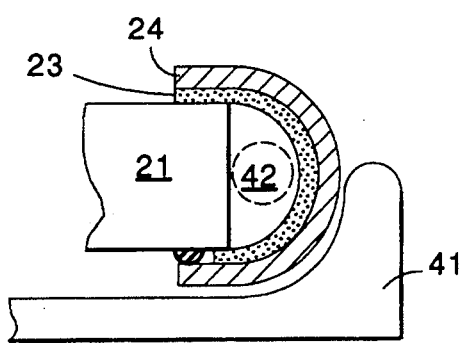

As illustrated in FIG. 4, resilient member 42 is optionally provided to support the leads along each edge of the die. Member 42 is preferably silicon rubber or other suitable compliant material. Member 42 is formed in a square loop and placed around the die. Mold 41 is similar to mold 37 except that mold 41 fits more closely around die 21 to curve lead 24 about the edge of die 21, and member 42 if present.

The first molding operation bends the leads on all four edges of the die simultaneously. For the second molding operation, the die is inverted and inserted into mold 41, thereby curving the inner portions of the leads. The leads extend further back on themselves, completely around the edge of die 21. The die is self-centering when placed in mold 41 because the leads were partially curved. The radius of curvature of the leads is slightly greater than half of the thickness of die, e.g. about ten to thirteen mils (0.25-0.33 mm). Since the copper deforms, the leads retain their curved shape. The inner polyimide layer acts as an insulator, preventing the leads from becoming shorted against the edge or back of die 21.

Separator 51 (FIGS. 5 and 6) is attached to die 21 with adhesive 52, such as what is known as room temperature epoxy (an epoxy that is kept refrigerated until use and cures at room temperature in about thirty minutes). Separator 51 is at least electrically insulating and is preferably also thermally conducting. Suitable materials include plastics, ceramic, sapphire, silicon, glass, or what is known as filled epoxy. The thermal conductivity of the separator must be balanced against the cost of the material. Sapphire and some thermally conductive ceramics, such as beryllium oxide, are expensive.

Separator 51 is approximately the same size as the die. As shown in FIG. 6, separator 52 has recesses or rabbets 54 and 55 in the upper and lower edges thereof. When separator 51 is adjacent to a die, the recess along the edge of the separator facing the die forms pocket 56 (FIG. 5) for loosely containing lead 24 and polyimide layer 23. Thus, any sideward force on lead 24 causes the lead to flex slightly and the end of lead 24 can move within pocket 56 if necessary. This enables the lead to absorb a greater range of flexure of lead 24 than would otherwise be possible.

As illustrated in FIG. 6, separator 51 preferably includes central aperture 58 extending through the central portion of separator 51 to facilitate the flow of cooling fluid to the back of die 21. Bores 59 at each corner of the separator extend from the outside surface to central aperture 58, enabling fluid to flow through the separator and contact the die.

Figure 5:
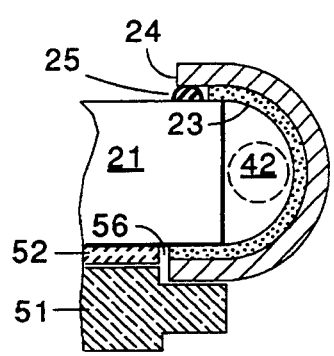
FIG. 5 is cross-section of a subassembly constructed in accordance with the invention.
Figure 7:
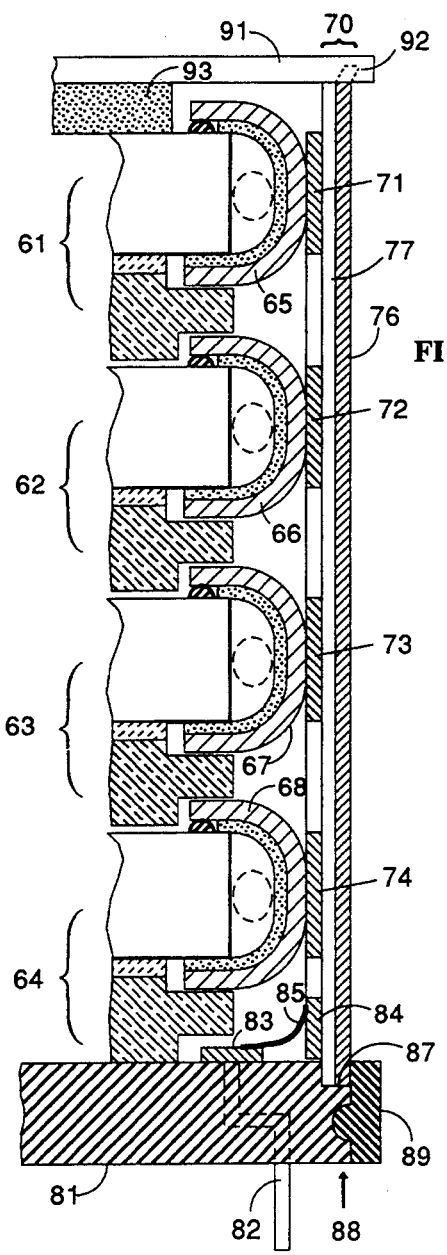
FIG. 7 is a cross-section of a portion of a stack package constructed in accordance with the invention.
Figure 6:
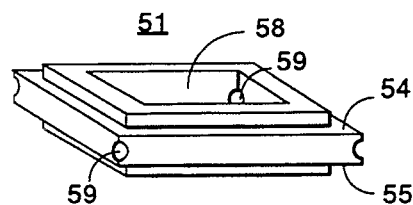
FIG. 6 is a perspective view of a separator constructed in accordance with the invention.

As thus constructed, the die and separator of FIG. 5 form a subassembly which is combined with other subassemblies to form a stack having alternate layers of semiconductor die and separators. One side of a packaged stack is illustrated in FIG. 7 wherein four subassemblies are combined within one package.

Figure 8:
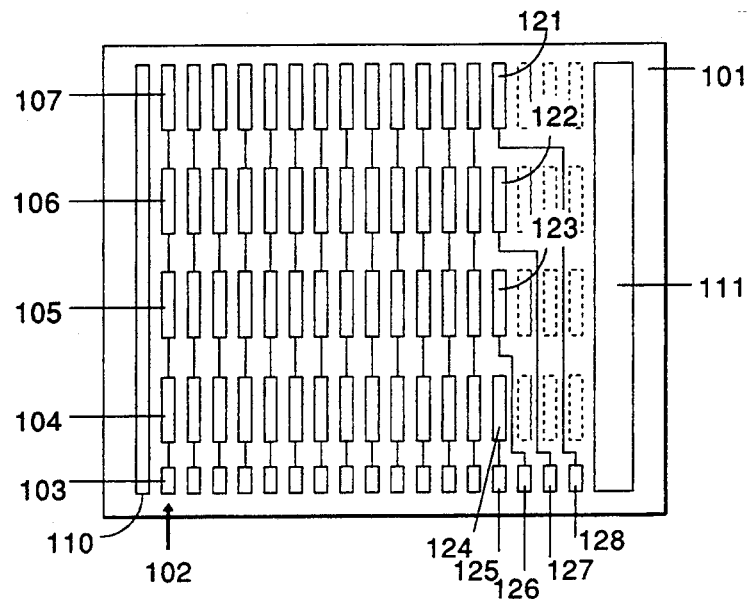
FIG. 8 illustrates a side of a package having conductors patterned in accordance with the invention.

Subassemblies 61—64 are stacked but not fastened to each other with leads 65—68 fitting within the pockets formed with the separators, both above and below the separators. Side 70 has contact areas 71—74 aligned or registered with leads 65—68. Side 70 preferably includes metal plate 76 having insulating layer 77 facing the edges of the die. A patterned conductive layer, described in detail in conjunction with FIG. 8, is formed on the insulating layer and defines contact areas 71—74. Metal plate 76 is preferably stainless steel and the insulating layer is preferably an epoxy. The conductors are copper with a thin gold outer layer for corrosion resistance and lower contact resistance.

The subassemblies rest on substrate 81. The substrate includes a plurality of pins, such as pin 82, which extend through substrate 81 and terminate in a contact pad. Contact pad 83 is connected to contact 84 on side 70 by way of wire 85, which is bonded to the contact and pad, e.g. by soldering or welding. The substrate is preferably a plastic material, such as used for packaging semiconductor devices, which is molded about the contact pins. Ceramic or printed circuit board substrates can be used instead. Wire 85 is one of a plurality of wires on a flexible circuit, such as a TAB leadframe. A TAB leadframe not only provides automatic registration of the wires but also greatly increases the speed with which the connections can be made.

The edge of substrate 81 has a couple of details which facilitate assembly. A first detail is recess 87 which receives the lower edge of side 70. A second detail is cove 88 formed in the edge of the substrate for receiving a corresponding bead on perimeter frame 89. Perimeter frame 89 is a hollow square or rectangle which fits around the bottom of the stack to engage substrate 81 and hold the sides in place.

In manufacturing a stack package in accordance with the invention, the substrate and sides form a second subassembly. The sides are connected to the substrate by a flexible circuit but are otherwise not rigidly attached thereto. The bottom edge of the side rests in recess 87 and the side can lie flat adjacent the substrate. The subassemblies of die and separators are placed on the substrate and the sides are rotated into a vertical position with the bottom edges of the sides located in the recess. The substrate, sides, and die are then inserted into perimeter frame 89, which holds the bottom edges of the sides in recess 87.

Top 91 is placed over the assembly and engages side 70 for locating the side vertically. The top edge of side 70 is preferably angled outwardly to engage recess 92 for securing the top to the side. Resilient layer 93, such as elastomer, applied to the underside of top 92, rests on the uppermost die to hold the die in position. One thus obtains a mechanically assembled package which is not permanently fastened. Defective sides or die are readily replaced. The use of a series of subassemblies, the TAB tape, die and separator, and substrate and side, facilitates rapid manufacture of devices.

As illustrated in FIG. 7, contact with the sides cause the leads to flex, distorting the curvature of the leads. up to a point, this is intended to assure a good mechanical contact. It is not intended that the leads be crushed against the edge of the die. It is preferred that the leads be moved no closer than half the distance to the edge of the die.

FIG. 8 shows a side having an array of conductors for interconnecting the die. Side 101 has a plurality of contact areas arranged in rows and columns. Column 102 includes contact areas 103-107 connected by a narrower conductor. In one embodiment of the invention, the contact areas are two mil wide conductors on four mil centers, i.e. two mil wide conductors and two mil wide spaces between any two conductors. The height of the contact areas is preferably the thickness of the corresponding die. This provides a high density of contact areas, yet is readily attainable with present technology. The height and width of the contact areas also assure reliable registration with the die.

The contact areas are separated into rows to avoid unintended connections between die. If the current through a conductor causes excessive voltage drop in a column, then the entire column is a full width conductor, as shown by conductor 110. If even that is insufficient, rows are ganged together with the space between covered with conductive material. Conductor 111 is the width of two columns plus the space between them.

The contact areas on side 101 can be connected in any combination, depending upon the particular die used and whether or not the die are identical. Even if the die are identical, the contact areas need not be arranged in columns. For example, the chip select leads on several memory die must be brought out to separate pins. Assuming that the column containing contact areas 121–124 corresponds to the chip select lead on each die, then contact areas 125–128 need to be connected to contact areas 121–124, respectively, in order to properly (uniquely) address each die. Thus, contact 121 is connected to contact 128, three columns away. Contact 122 is connected to contact 127; contact 123 is connected to contact 126; and contact 124 is connected to contact 125.

The contact areas shown in dotted line in FIG. 8 are either left disconnected or are omitted. Although a single layer conductive pattern is illustrated in FIG. 8, it is understood that a multi-layer conductive pattern can be used instead. As noted above with the choice of material for the separator, the trade-off here is cost. Multi-layer conductor patterns are more expensive.

Figure 9:
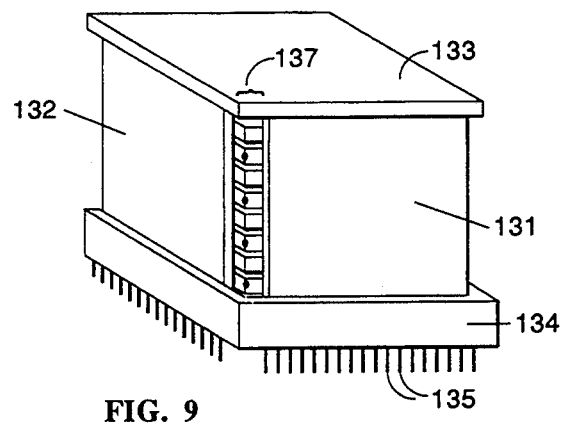
FIG. 9 is a perspective view of a complete package constructed in accordance with the invention.

FIG. 9 illustrates a complete stack package constructed in accordance with the invention. Perimeter frame 134 surrounds the substrate containing a plurality of conductive pins 135 and holds the walls, including sides 131 and 132 in place. Top 133 is fastened to the sides as described. The sides do not fill the available space between the corners of perimeter frame 134. This provides a gap, such as gap 137, at each corner of the package for enabling cooling fluid to flow through the device through the apertures in the separators.

The embodiment of FIG. 9 assumes that the package is being used in a sealed environment providing fluid flow. If this is not the case, then the structure of the separator is greatly simplified. Central aperture 58 and bores 59 can be eliminated. The structure of FIG. 9 is sealed, e.g. by potting or separate walls around the sides, with the walls sealed to each other and to the top and bottom.

FIG. 10 illustrates a portion of a subassembly constructed in accordance with an alternative embodiment of the invention. Specifically, separator 140 is a die carrier; i.e. separator 140 is substantially wider than the die and includes a recess for receiving die 148. Lead 141 from a TAB leadframe is bent over the edge of the separator with lead 141 on the outside of the curve and insulator 142 on the inside of the curve. The inner end of insulator 142 is attached to the upper surface of separator 140 by a suitable adhesive (not shown).

The free ends of lead 141 and insulator 142 extend into pocket 145 where they are free to move slightly. Recess 146 provides clearance for other subassemblies or for the connections to the bottom of the package. Resilient member 147 is optionally provided and is preferably a square loop of material which is placed around the separator. Wire bond 149 connects one contact on die 148 to lead 141.

Die 148 is attached to separator 140 either before the leads are curved or after. If the leads extend over the die, as in FIG. 2, then the leads are soldered or welded to the die. If the leads do not extend over the die, then the leads are wirebonded to the die. Thus, an advantage of this embodiment is that the die are connected after the leads are bent, resulting in somewhat less handling of the die. Another advantage of this embodiment is that the separators act as adapters for different size die. A disadvantage of this embodiment is that the package becomes considerably larger due to the increased width and length of the separator.

Lead 141 and insulator 142 extend some distance inwardly from the edge of separator 140. One could substitute a conductive layer deposited on separator 140 for a portion of the lead. In this case, the lead is connected to the conductive layer by a solder bump, as in FIG. 5. Conductive patterns are easily and inexpensively formed on silicon substrates, which can also serve as insulators. FIG. 11 illustrates a portion of a subassembly in which the separator is a multi-element structure including silicon substrate 151 and insulator 152 connected by adhesive 153. Adhesive 153 is any suitable adhesive such as epoxy or solder glass.

Substrate 151 and insulator 152 form pocket 154 for receiving the free ends of lead 155 and flexible insulator 156. The other end of lead 155 is attached to metal layer 157 formed on the upper surface of substrate 151. Metal layer 157 is connected to a contact on die 158 by wire bond 159. Die 158 is attached to substrate 151 by adhesive or intermediate fused glass layers or other means well known per se in the art. As with other embodiments of the invention, resilient member 160 is optionally provided.

The embodiment of FIG. 11 enables one to use die of various sizes simply by making substrate 151 the size of the largest die in the stack. In addition to being able to combine die of various sizes in a single stack, thermal stress is reduced since the die are mounted on a silicon substrate. Metal layer 157 is easily formed using techniques long known in the semiconductor art. Multi-layer conductors can be used instead of the single layer illustrated.

FIG. 12 illustrates a cross-section of a portion of a subassembly constructed in accordance with another alternative embodiment of the invention. For this embodiment, the leadframe of the TAB tape is bonded face down to the die and the tape is above the leadframe. Specifically, die 161 has a contact connected to lead 162 by solder bump 163. Lead 162 is wrapped about a portion of separator 164, with insulator 165 on the inside of the curve, and engages pocket 166. Separator 164 is attached to die 161 by sealing member 167. Sealing member 167 is a polyimide ring or a sealing glass having a low melting point. Resilient member 169 is optionally provided to support the leads during compression from the sides of the stack.

Unlike the embodiment of FIG. 6, separator 164 preferably does not have an aperture extending completely through the separator. Instead, the lower surface of the separator is intact and bores 59 communicate with a central opening extending through the upper surface only. By sealing the upper surface of die 161 to separator 164, one protects the die from ambient particles and moisture. However, the back side of the die is exposed to the cooling flow of fluid through the separator of the next lower subassembly in the stack or the bottom of the stack.

As with the embodiment of FIGS. 10 and 11, the embodiment of FIG. 12 can accommodate die of different sizes without substantially increasing the overall size of the package. In this case, the separators should all be the same size, viz. the size of the largest die to be included in the stack. In these embodiments, the stack is assembled from the bottom up, i.e. the first subassembly placed in the stack is the closest to the external leads of the stack.

FIGS. 13 and 14 illustrate an alternative embodiment of the invention in which the stack is assembled from the top down, i.e. the first subassembly placed in the stack is the farthest from the external leads of the stack. In this embodiment, the separator has a perimeter wall and the leads from a device curve over the wall and resiliently contact a side having a plurality of conductors on the inside surface thereof. Specifically, separator 201 includes a major surface having recess 202 therein and die 203 in recess 202. A leadframe is attached to die 203 as described above and the leads, such as leads 205 and 206, extend from a first edge of the die over perimeter wall 207 to support 212. A plurality of leads extend over a second edge, opposite the first edge, to support 213. The leadframe is cut away and the leads are bent around separator 201. Although leads are shown extending across only two edges of die 203, it is understood that any number of leads can be used and that they can extend from one or all edges of the die. Metallized area 210 contacts the back side of die 203 and extends from underneath die 203, up and over perimeter wall 207. Contact to area 210 is made by lead 211, which extends to support 212. Separator 201 is preferably made from ceramic and metallized area 210 is formed by copper bonding. The leads from the leadframe are attached to die 203 by wire bonding, welding, or solder bumps. Die 203 is attached to separator 201 by conductive epoxy, eutectic bonding, solder or glass. Die 203 and separator 201 are a subassembly which can be stacked with other subassemblies. Perimeter recess 209 provides clearance for the leads from an underlying subassembly.

FIG. 15 illustrates the assembly of a stack having a flexible cover permitting the sides of the stack to be tilted open for loading subassemblies. The stack is shown upside down, i.e. the top of the stack is in the lower portion of FIG. 15. In FIG. 15, stack 220 includes three subassemblies and separator 222, which has no die. Flexible cover 223 includes central portion 224, arm 225 and arm 226. Sides 231 and 232 have the top ends thereof placed within and against the respective arms of cover 223. Separator 222 is placed between sides 231 and 232, holding the sides in place against arms 225 and 226. This confines or traps the sides and facilitates assembly. If leads extend from only one edge of the die, two sides are used and one of the sides is thicker to compensate for the absent leads. The bottom ends of the sides are spread, producing a taper to facilitate the insertion of the subassemblies. When the sides are splayed, central portion 224 flexes into the recess in separator 222. The subassemblies are inserted between the sides, either singly or as a group. The bottom ends of the sides are moved together to their normal or nominal position and the leads from each die resiliently contact respective conductive areas on the interior surfaces of sides 231 and 232.

Sides 231 and 232 are constructed in the same manner as the sides shown in FIGS. 7 and 8 and include backing plate 241, insulating layer 242, and patterned, conductive layer 243. Insulating layer 242 is preferably a layer of silicon rubber which not only electrically insulates but also provides some resiliency under the conductive layer.

FIG. 16 shows a completed stack including compliant layer 251 and polyimide tape 252 overlying the compliant layer and holding the bottom of the stack together. Alternatively, the sides can be held together with a perimeter frame or other mechanism. After assembly, the stack is inverted and connected to a printed circuit board by the leads from conductive layer 243, such as leads 253 and 254. Leads 253 and 254, and all of the other leads, either fan out to produce the contact pattern of a device package, such as a quad flatpack, or simply extend straight away from the sides for a smaller outline with the leads closer together.

The invention thus provides an improved package for stacked die. Heat generated during operation does not stress the die as much since they are not rigidly connected to the sides of the package. Further, the package can be disassembled in the event that the completed device fails final test. This provides significant cost savings over other packages. Leads extend from all four sides of the package, increasing the complexity the integrated circuit die that can be accommodated by the stack. Alternatively, because the entire periphery of the die is used for leads, the same number of leads is spread over a greater distance, thereby simplifying registration of the leads with the conductors and increasing the heat conductivity of the leads by increasing their width. The heat generated by the stack is more readily removed by virtue of the construction of the separators and the open corners of the package. Alternatively, the separators are solid and made from electrically insulating, thermally conducting material such as sapphire, silicon, or thin glass.

Having thus described the invention, it will be apparent to those of skill in the art that various modifications can be made within the scope of the invention. For example, while illustrated as having a circular cross-section, resilient members 42, 147 can have any suitable cross-section. Separator 51 need not be a solid insulator but can be a multi-layer device, e.g. an electrically conductive layer between two insulating layers forming a central ground plane for shielding the die from RF. The ground plane is connected either to the sides or to the ground lead on the die.

Side 70 can be a large silicon die having the conductors, contacts and insulators made in accordance with well known semiconductor processing technology. Multilayer conductors can be employed in the substrate and in the sides. This is particularly useful when more than one stack is mounted to a substrate, because of the number of leads emanating from several stacks.

Although a simple snap mechanism is used to hold top 91 in place, a variety of fastening techniques can be used to hold the package together. For example, an external member engaging the substrate and the top is used instead of the angled ends of the sides to hold the package together. For die having contact adjacent all four edges, two flexible covers are used. The sides can provide connections between points on the same die and connection between.

What is claimed is:

1. A three dimensional semiconductor device comprising:
    a plurality of integrated circuit die each having a first edge, a second edge, and a plurality of contacts along at least said first edge;
    a plurality of separators;
    said die and said separators arranged in a stack of alternating layers of die and separators, wherein said first edges of all of the die face in a first direction and said second edges of all of the die face in a direction opposite said first direction;
    a plurality of electrically conductive leads arranged in groups, one group for each die, the leads in each group having inner and outer ends, wherein the inner ends are connected one each to the contacts on a die and the outer ends are curved over an edge of said die;
    a first side having a plurality of electrically conductive contact areas connected in a predetermined pattern, wherein said first side is located adjacent the first edges of said die and the curved portions of the leads extending over said first edges resiliently contact said contact areas;

a second side located adjacent the second edges of said die; and a flexible cover engaging said first side and said second side and holding said sides in place.

2. The device as set forth in claim 1 wherein some of said leads curve over said second edge, said second side has a plurality of electrically conductive contact areas connected in a predetermined pattern, and the curved portions of the leads extending over said second edge resiliently contact said contact areas on said second side.

3. The device as set forth in claim 1 wherein said flexible cover includes a central portion and a pair of arms attached to said central portion, said central portion flexing when said arms are moved.

4. The device as set forth in claim 1 wherein said separators each include a first major surface and a recess in said first major surface for receiving a die.

5. The device as set forth in claim 4 wherein said separators each include a second major surface and a perimeter recess in said second major surface.

6. A semiconductor device including a plurality of die in a stack and a plurality of curved leads extending from each of said die, said device further comprising:

a pair of sides, each side having a plurality of electrically conductive areas connected in a predetermined pattern, wherein said sides are located on opposite sides of said stack and said curved leads resiliently contact said conductive areas; and a flexible cover holding said sides against said stack, said cover having a first arm engaging a first of said pair of sides and a second arm engaging a second of said pair of sides.

7. The device as set forth in claim 6 wherein said flexible cover includes a central portion having said arms attached to said central portion and wherein said central portion flexes when said arms are moved.

* * * * *